US007612343B2

(12) United States Patent
Vickers

(10) Patent No.: US 7,612,343 B2
(45) Date of Patent: Nov. 3, 2009

(54) COLLIMATOR FOR RADIATION DETECTORS AND METHOD OF USE

(75) Inventor: David S Vickers, Independence, OH (US)

(73) Assignee: GVI Medical Devices, Twinsburg, OH (US)

( * ) Notice: Subject to any disclaimer, the term of this patent is extended or adjusted under 35 U.S.C. 154(b) by 0 days.

(21) Appl. No.: 11/872,513

(22) Filed: Oct. 15, 2007

(65) Prior Publication Data

US 2008/0087828 A1 Apr. 17, 2008

Related U.S. Application Data

(60) Provisional application No. 60/829,621, filed on Oct. 16, 2006.

(51) Int. Cl.
*G21K 1/02* (2006.01)
*H01L 27/146* (2006.01)
*G01T 1/166* (2006.01)

(52) U.S. Cl. .............................. 250/363.1; 250/370.09; 250/363.04

(58) Field of Classification Search .............. 250/363.1, 250/363.04, 363.03, 363.01, 362, 370.09, 250/370.08, 363.06, 394
See application file for complete search history.

(56) References Cited

U.S. PATENT DOCUMENTS

| | | | |
|---|---|---|---|
| 4,151,416 | A | 4/1979 | Richey et al. |
| 4,223,221 | A | 9/1980 | Gambini et al. |
| 4,424,446 | A | 1/1984 | Inbar et al. |
| 4,882,494 | A | 11/1989 | Rogers et al. |
| 4,899,054 | A | 2/1990 | Barfod |
| 5,079,424 | A | 1/1992 | Kobayashi |
| 5,171,986 | A | 12/1992 | Loomis et al. |
| 5,237,173 | A | 8/1993 | Stark et al. |
| 5,412,215 | A | 5/1995 | Shuto et al. |
| 5,550,377 | A | 8/1996 | Petrillo et al. |
| 5,646,408 | A | 7/1997 | Goldberg et al. |
| 5,677,536 | A | 10/1997 | Vickers |
| 5,684,850 | A | 11/1997 | Warburton et al. |
| 6,087,656 | A | 7/2000 | Kimmich et al. |
| 6,134,293 | A | 10/2000 | Guendel |
| 6,342,698 | B1 | 1/2002 | Stark |

(Continued)

FOREIGN PATENT DOCUMENTS

WO WO 02099459 A1 12/2002

OTHER PUBLICATIONS

International Search Report dated Jun. 26, 2006.

*Primary Examiner*—David P Porta
*Assistant Examiner*—Faye Boosalis
(74) *Attorney, Agent, or Firm*—Pearne & Gordon LLP

(57) ABSTRACT

A device and method for acquiring Single Photon Emission Computed Tomography (SPECT) data. In particular, a method of acquiring data using a gamma camera detector with a collimator, such as a slotted, inverse fan beam collimator, for example. An example collimator that can be used for the method is one comprising: a slot substantially parallel to the axis of rotation of a SPECT scanner; a plurality of plates, each one of the plates being substantially perpendicular to the slot and also being substantially parallel to a transaxial direction of the SPECT scanner; and a detector associated with the slot and the plurality of plates such that, through any motion of the scanner, the slot, the plates and the detector retain their relative positional relationship.

29 Claims, 6 Drawing Sheets

U.S. PATENT DOCUMENTS

| | | | | |
|---|---|---|---|---|
| 6,525,320 | B1 | 2/2003 | Juni | |
| 6,525,321 | B2 | 2/2003 | Juni | |
| D474,277 | S | 5/2003 | Juni | |
| 6,757,423 | B1 | 6/2004 | Amini | |
| D492,988 | S | 7/2004 | Juni | |
| 7,012,257 | B2 | 3/2006 | Juni | |
| 7,015,476 | B2 | 3/2006 | Juni | |
| 7,071,473 | B2 | 7/2006 | Juni | |
| 7,105,825 | B2 * | 9/2006 | Juni | 250/363.04 |
| 7,158,661 | B2 | 1/2007 | Inoue | |
| 7,310,407 | B2 * | 12/2007 | Juni | 378/63 |
| 7,339,174 | B1 * | 3/2008 | Hugg et al. | 250/363.1 |
| 7,346,381 | B2 | 3/2008 | Okerlund et al. | |
| 2002/0163996 | A1 | 11/2002 | Kerrien et al. | |
| 2003/0057375 | A1 | 3/2003 | Williams et al. | |
| 2003/0136912 | A1 | 7/2003 | Juni | |

* cited by examiner

COLLIMATOR FOR RADIATION DETECTORS AND METHOD OF USE

CROSS-REFERENCES TO RELATED APPLICATIONS

This application claims the benefit of U.S. Provisional Application Ser. No. 60/829,621, which was filed on Oct. 16, 2006.

FIELD OF THE INVENTION

This application relates generally to a device and method for acquiring Single Photon Emission Computed Tomography (SPECT) data.

More specifically, this application relates to a method of acquiring data using a gamma camera detector with a collimator, such as a slotted, inverse fan beam collimator, for example.

BACKGROUND OF THE INVENTION

In the field of Medical Imaging, one modality is Nuclear Medicine (gamma camera, SPECT and PET) imaging. This modality uses a detector consisting of a scintillator backed by a plurality of photomultiplier tubes (PMTs) with appropriate electronics. A patient is given a radioisotope either by injection or ingestion and the detector(s), after being placed in close proximity to the patient, can determine where the radioisotope goes or has gone.

The process of detection is when the radioisotope emits a gamma photon in the direction of the detector; it is absorbed by the scintillator. The scintillator emits a flash of light (a scintilla) which is detected by the plurality of PMTs. The PMTs closer to the flash have a higher signal than those further away. By measuring the intensity of the flash at each PMT, then using a centroid type calculation, a fairly accurate estimation of where the flash occurred is possible. All this is well known in the art.

During the process of image reconstruction in a SPECT or PET system, correcting for the probable attenuation of the gamma photons is desirable. When corrected for attenuation, images are much more accurate and less prone to diagnostic errors.

To image accurately some type of collimation is needed. Traditionally, a parallel hole collimator is used. This typically allows only gamma rays traveling perpendicular to the face of the detector, to be detected. Other gamma rays, traveling obliquely to the face of the detector, are typically absorbed by the lead in the collimator.

Alternate types of collimators have been used for different types of studies. For example, a pinhole collimator is sometimes used to image specific organs such as the thyroid. The principle behind a pinhole collimator is similar to a pinhole camera or camera obscura, i.e., only photons traveling through the pinhole strike the detector. An advantage of a pinhole collimator is it can achieve high magnifications with high resolution. A disadvantage is because photons can only travel through the pinhole, the sensitivity of the system can be poor.

Another type of collimator is a fan beam collimator. This type of collimator is used to acquire fan beam type data for use in fan beam reconstructions. It can again achieve magnification (or demagnification), but typically only in one dimension, i.e., the direction of the fan beam.

Yet another type of collimator is a cone beam collimator. A cone beam collimator can be either converging or diverging.

A converging cone beam collimator is a demagnifier allowing viewing of larger objects using a smaller detector. A diverging cone beam collimator is a magnifier allowing better visualization of small objects.

A problem for typical collimators is sensitivity. Because collimators essentially reject any gamma photons which are not parallel to the holes or apertures in the collimators, a large percentage of photons traveling in the general direction of the detector are absorbed by the collimator and not detected for use in the images. While this may allow good images to be generated, it can take significant time to detect enough photons to generate a good low noise image.

Another problem for collimators is due to the optics of the collimator; the resolution of collimator-detector system deteriorates the further the object is from the face of the collimator.

It would be useful to improve the sensitivity of a collimator and improve the resolution of a collimator, especially at significant distance from the detector.

U.S. Pat. Nos. 6,525,320; 7,012,257; 7,015,476; 7,071,473; all incorporated herein by reference, describe using a stationary collimator with multiple slots in front of a large, stationary, arcuate detector. This typically allows for no space or method for acquiring attenuation correction data in the SPECT system. In addition, the slot of the collimator moves in relation to the detector. This typically requires having a large, expensive detector behind the collimator. Economically, the detector is typically the expensive component in the assembly. The collimator is typically relatively inexpensive. It would be more economical to have smaller detectors, each with its own collimator. In addition, since the detector is one continuous arc, there is typically no place to put a co-planar CT type system for generating attenuation correction maps.

SUMMARY OF THE INVENTION

Provided are a plurality of embodiments the invention, including, but not limited to, a collimator for gamma camera imaging, with the collimator comprising: a slot substantially parallel to the axis of rotation of a SPECT scanner; a plurality of plates, each one of the plates being substantially perpendicular to the slot and also being substantially parallel to a transaxial direction of the SPECT scanner; and a detector associated with the slot and the plurality of plates such that, through any motion of the scanner, the slot, the plates and the detector retain their relative positional relationship.

Also provided is a collimator for a gamma camera imaging, with the collimator comprising: a pair of bars for forming a slot substantially parallel to the axis of rotation of a scanner, wherein a width of the bars is adjustable; a plurality of plates distributed along the slot, each one of the plates being substantially perpendicular to the slot and also being substantially parallel to a transaxial direction of the scanner, wherein the plates are comprised of a radiation absorbing material; a low-density material for separating the plates from each other; and a detector associated with the slot and the plurality of plates such that, through any motion of the scanner, the slot, the plates and the detector retain their relative positional relationship.

Further provided is a method for imaging a body part using a collimator, the method comprising the steps of:

- providing a radiation source;
- providing a collimator including a radiation detector, a slot, and a plurality of plates separated from each other and arranged in space with the slot;
- providing the focus of the collimator between the body part and the collimator slot; and scanning the body part using the collimator and radiation source, the scanning by concurrently detecting a plurality of parallel, rectangular slices of the body part, the geometry of the slices being defined by the arrangement and the separation, and wherein the slices do not substantially overlap each other.

Also provided is a collimator, such as one discussed above, where the plates are separated from each other by a separation distance, the method further comprising the step of modulating a position of the collimator relative to the detector by an amount substantially equal to one half the separation distance with a frequency of at least two times per acquisition frame time.

BRIEF DESCRIPTION OF THE DRAWINGS

The features and advantages of the examples of the present invention described herein will become apparent to those skilled in the art to which the present invention relates upon reading the following description, with reference to the accompanying drawings, in which.

DETAILED DESCRIPTION OF THE EXAMPLE EMBODIMENTS

Provided is an invention comprising a plurality of embodiments, including, but not limited to, a method of collimation for a gamma camera utilizing a fan beam type approach, which allows magnification, demagnification, reduced resolution deterioration with distance and increased sensitivity. This method can allow use of a traditional attenuation correction scheme.

One apparatus for practicing the method is called an "inverse" fan beam collimator. In a traditional fan beam collimator the object to be imaged is between the focus of the collimator and the aperture of the collimator. In the inverse fan beam collimator, the focus of the collimator is instead between the object being scanned and the aperture slot of the collimator, causing a geometric "inversion" of the image in one dimension.

Figure 1:
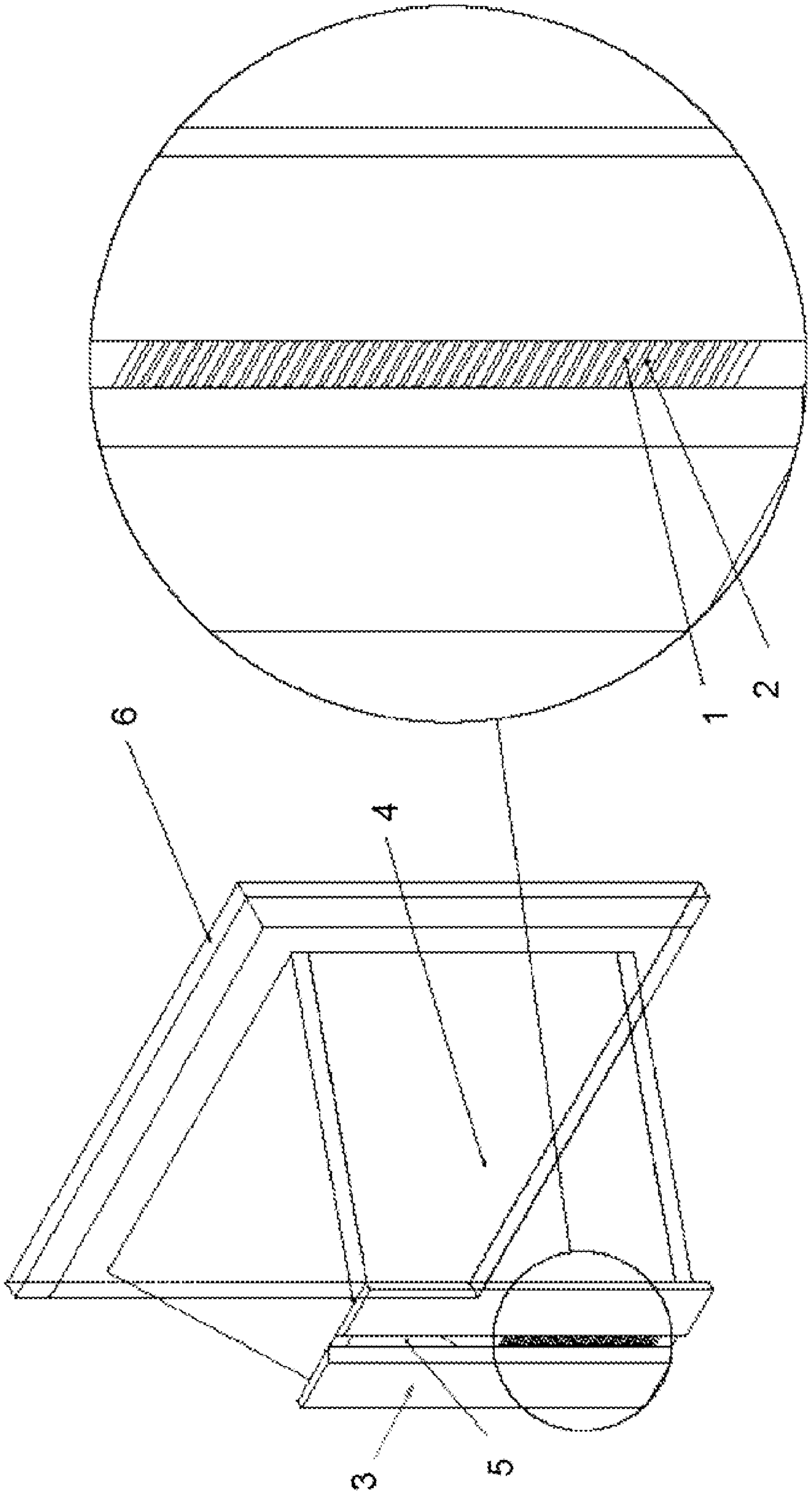
FIG. 1 is a schematic diagram of an example embodiment of an inverse fan beam collimator, front view.
Figure 2:
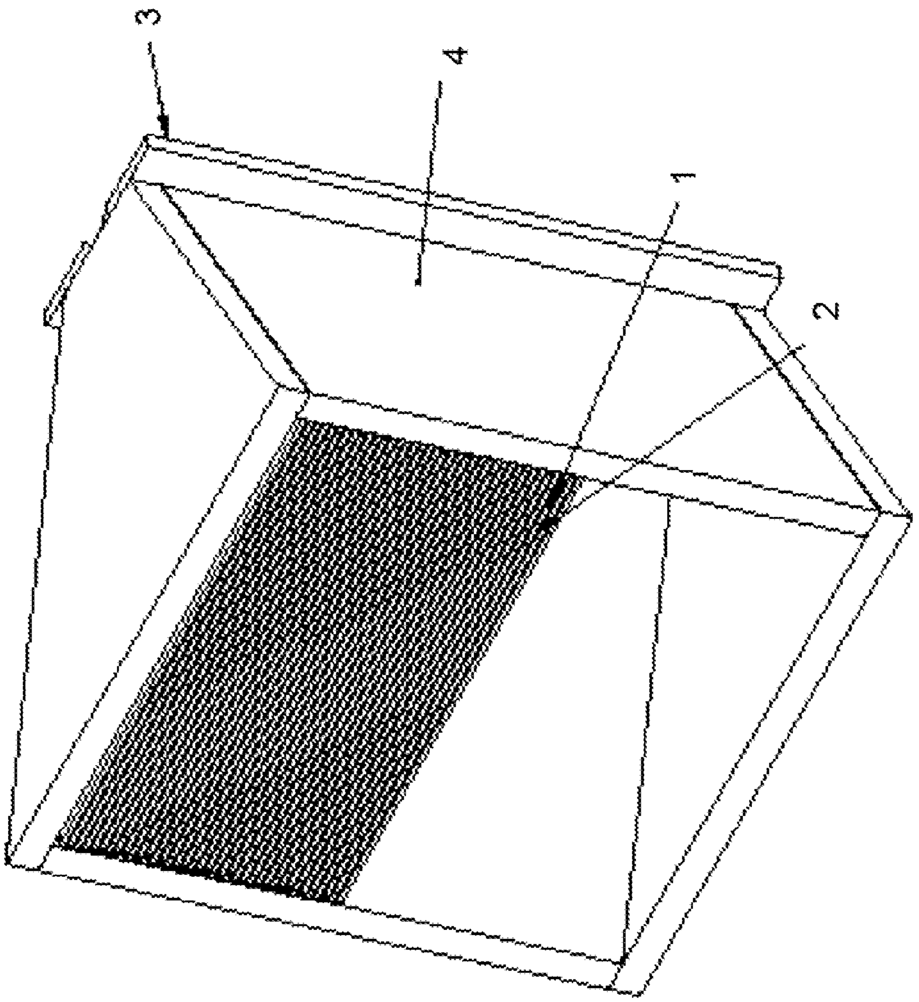
FIG. 2 is a schematic diagram of the example embodiment of the inverse fan beam collimator, rear view.

The inverse fan beam collimator can help overcome the system sensitivity and resolution limitations of traditional parallel hole collimators. The device discussed herein, as shown schematically in FIGS. 1 and 2 (showing a front and a back view of the collimator, respectively), includes an aperture slot 5 proximal to an object being scanned (not shown), with parallel, attenuating plates 1 orthogonal to the slot 5, and between the aperture slot 5 and having a scintillation detector 6 effectively extending the distance between the aperture slot 5 and the detector 6. A collimator 4 is fastened to a scintillation detector 6 to register the aperture slot 5 to the scintillation detector 6. In this way, as the detector 6 rotates to acquire SPECT data, the collimator 4 rotates with the scintillation detector 6. The schematic of FIGS. 1 and 2 show one-half of the collimator plates removed for drawing clarity, instead showing only those in the lower portion. In actual practice, the collimator plates would normally be provided along all or most of the length of the slot 5.

The resolution of such a device has two components. In the direction parallel to the aperture slot 5, i.e., perpendicular to the attenuating plates 1, the resolution approaches that of the plate separation 2 convolved with the intrinsic resolution of the detector 6. In a normal SPECT scanning operation, this would be the resolution between image slices. In the direction perpendicular to the aperture slot 5 direction, the resolution is basically the intrinsic resolution of the detector convolved with the aperture slot 5. Assuming a detector intrinsic resolution of about 3 mm with no magnification, and a slot aperture of about 2 mm, the resulting image resolution would be about 4 mm. A typical parallel hole collimator resolution, in contrast, is on the order of about 8 mm or more.

In addition, because the aperture slot 5 can be conceptually thought of as a pinhole collimator extended in one dimension, the resolution perpendicular to the aperture slot 5 direction, at depth, should not deteriorate as much as in a parallel hole collimator. This result can be attributed to the uncertainty of the source of the counts. In a parallel hole collimator, each individual hole actually "sees" a cone of potential source points. As the distance from the collimator increases, the cone becomes larger. At some distance, the cones from the holes begin to overlap, and it becomes more difficult or impossible, to determine the location of where some events have occurred. At some further distance, all of the cones may mostly or completely overlap, making it impossible to determine the location of most, or even all, of the detected events.

By using an inverse fan beam collimator, such as that discussed above, in a manner such as the method described herein, however, the potential source points have much less uncertainty. No matter how far the source point is placed from the collimator 4, the location of the source point is confined to a thin wedge, with its apex at the detected point on the detector 6 and its sides touching the aperture of aperture slot 5. While wedges from different detector points may, in some instances, overlap slightly, a complete overlap can be avoided no matter how far one is from the collimator, in contrast to the results provided by a parallel hole collimator. Therefore, there can be less uncertainty in the location of the source point of an event using the device and method of the invention.

To manufacture a collimator such as the one discussed above, one can use a means to keep the attenuating plates 1 separated by a constant distance, parallel to each other and perpendicular to the aperture slot 5 direction. A typical material for the plates 1 would be a stiff and dense material, such as lead-antimony alloy with about 5% (a value of 2% to 5% would typically be acceptable) antimony to increase the stiffness of the plates; or tungsten could be used in place of the lead-antimony alloy; or the plates 1 could be comprised of any highly attenuating material with adequate stiffness. The thickness of the plates should be relatively thin, about 0.5 mm or less (a thickness of 0.25 to 0.5 mm would typically be acceptable). The separation can be on the order of about 2 mm (a separation of 1.5 to 4 mm would typically be acceptable).

To keep the plates 1 separated, one could use some type of shim. This "shim" should provide as low an attenuation as possible. Typical materials that could be utilized for this "shim" include polystyrene foam, aero-gel, balsa wood, or some other low density plastic foam. Whatever material is used, it should have sufficient rigidity to keep the plates separated by a relatively constant distance, such that the lower plates are separated by about the same distance as the upper plates. A typical preferred thickness for the shims would be approximately 3 mm.

The aperture slot 5 can be defined by a pair of bars, such as knife edges 3 that can be comprised of a material such as tungsten, for example. To improve the attenuation at the knife edges 3, a coating can be used, although it is not required. This coating can be of any of several possible high Z, high density materials, including one or more of Osmium, Rhenium, depleted Uranium, Rhodium and Iridium. The knife edges 3 can be made adjustable, for example, to allow for increased resolution, when desired, by providing a narrowing of the slot width 5. Alternatively, if resolution is not as important, sensitivity can be increased by widening the slot width 5.

Figure 3:
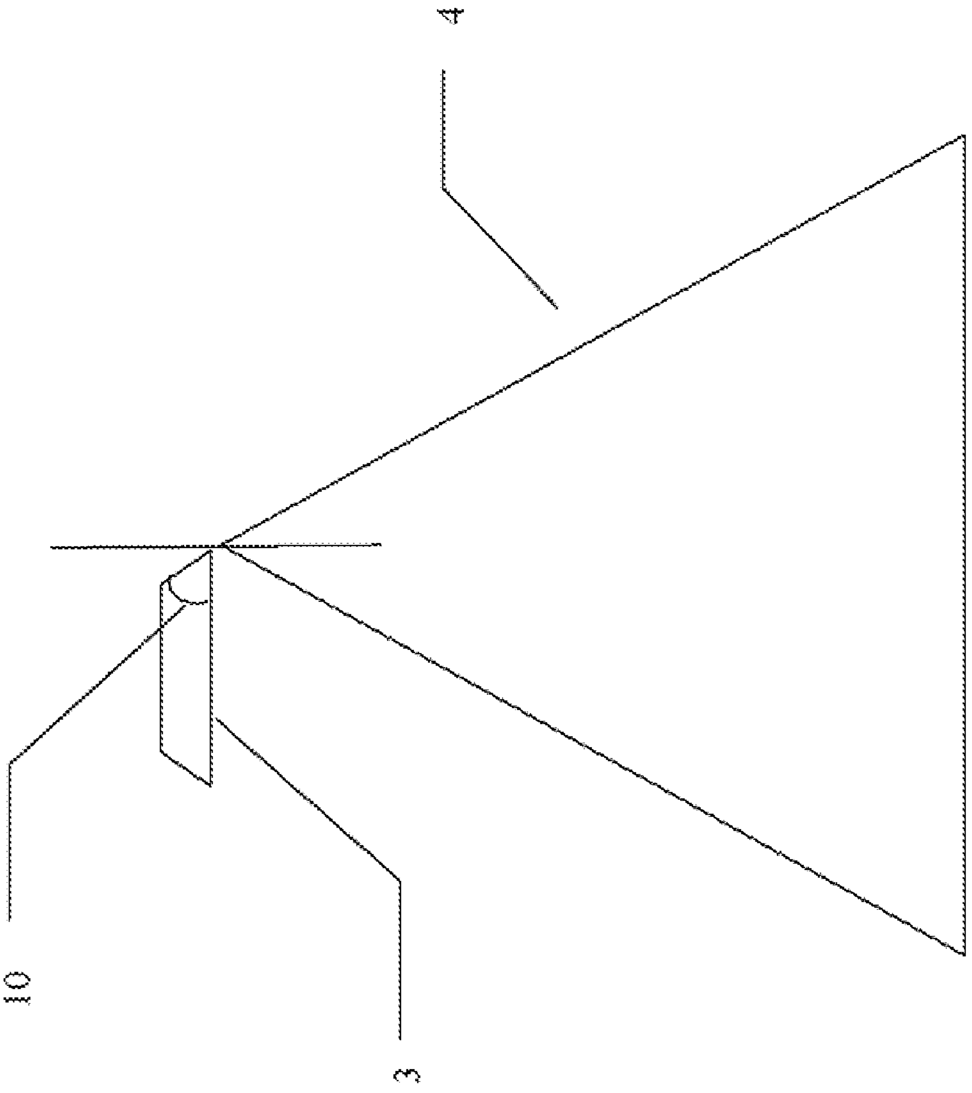
FIG. 3 is a schematic diagram showing a useful angle for the bevel on a knife edge.
Figure 4:
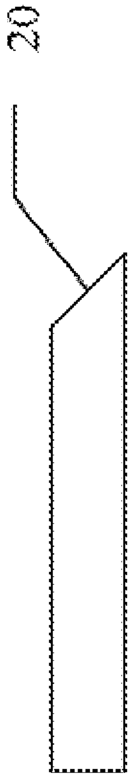
FIG. 4 is a schematic diagram of a single bevel knife edge.
Figure 5:
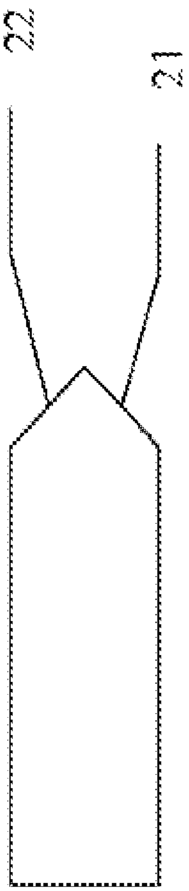
FIG. 5 is a schematic diagram of a double bevel knife edge.

Referring now to FIG. 3, which is a diagram showing the preferred angle for the bevel on the knife edge, the angle of the knife edges 3 should be provided such that the angled portion is substantially parallel to the opposite side of the outer surface of the collimator 4. Thus, if the collimator is 6 inches deep, and 10 inches wide at the detector, the angle of the knife edge 10 would preferably be 90°−arctan((10/2)/6). Additionally, as shown in FIGS. 4 and 5, the knife edges may, as examples, have a single beveled edge 20 or a double beveled edge 21, 22. In the case of the double bevel knife edge version, both angles would preferably be such that the bevels are parallel to one or the other side of the surface of the collimator 4.

Figure 7:
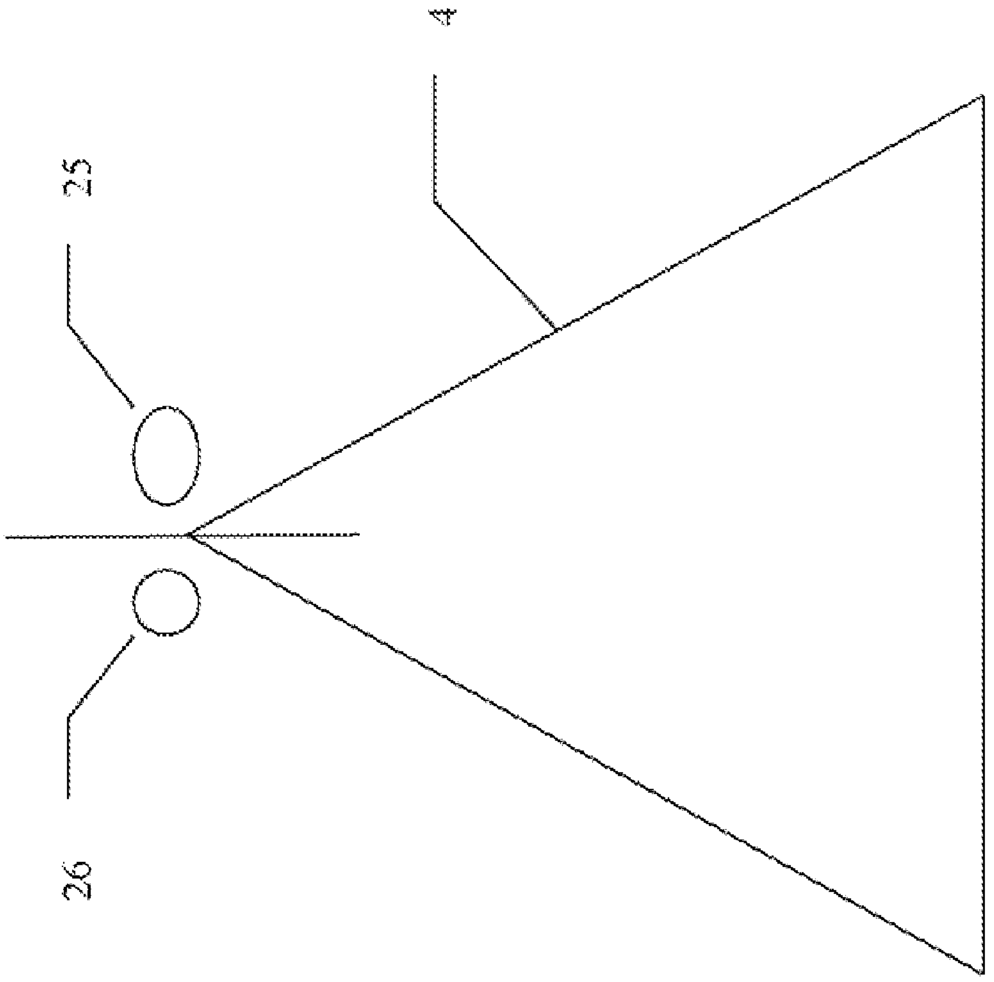
FIG. 7 is a schematic diagram showing an alternative of the example embodiment utilizing rods instead of the knife edge.

Referring to FIG. 7, as alternative methods of forming the slot, two elliptical 25 or circular 26 cross-section, parallel rods may be used in the place of the knife edges 3; or just the edges defining the slot may be of circular or elliptical arc shape. In either case, the rods would still be comprised of tungsten with the possible alternative coatings discussed above.

Figure 6:
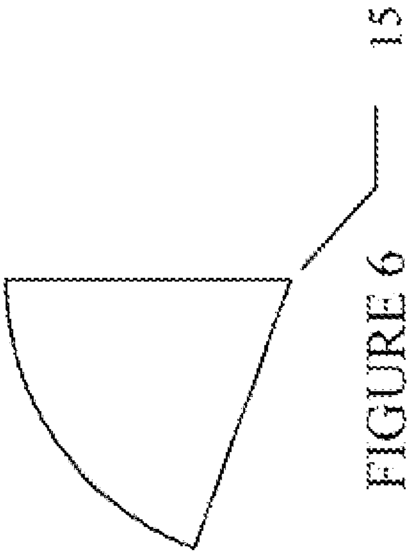
FIG. 6 is a schematic diagram of a pie wedge shaped lead vane that can be used with the Example embodiment.

As an additional improvement, sensitivity can be increased and made more uniform across the field of view by using a constant length lead vane, such as depicted in FIG. 6, in the shape of a pie wedge, where the apex 15 is nearest the slot aperture.

Another improvement can be achieved in another embodiment by adding a thin sheets of copper, preferably of a total thickness of about 0.020 inches, between the collimator and the detector input surface. The copper will filter out the lead fluorescence x-ray produced when the lead absorbs typical gamma radiation produced by the most common radioisotopes used in nuclear imaging.

Still another modification would be to use a non-Anger type gamma camera. These types of gamma cameras include pixilated cameras, solid-state cameras, and non-planar cameras.

A non-planar camera would have the input crystal formed into an arc with the radius substantially equal to the distance from the focus of the inverse fan beam collimator to the input surface of the crystal. This would provide the benefit of uniform sensitivity across the input face of the detector.

Still another improvement would be to modulate, that is, physically move, the collimator, but not the detector, in the direction parallel to the rotation axis. The distance of modulation would be one half the distance between the lead vanes. The frequency of modulation would be at least 2 cycles per acquisition frame. This would have the effect of smoothing out or blurring out any sensitivity modulation caused by the absorption of the lead vanes.

Figure 8:
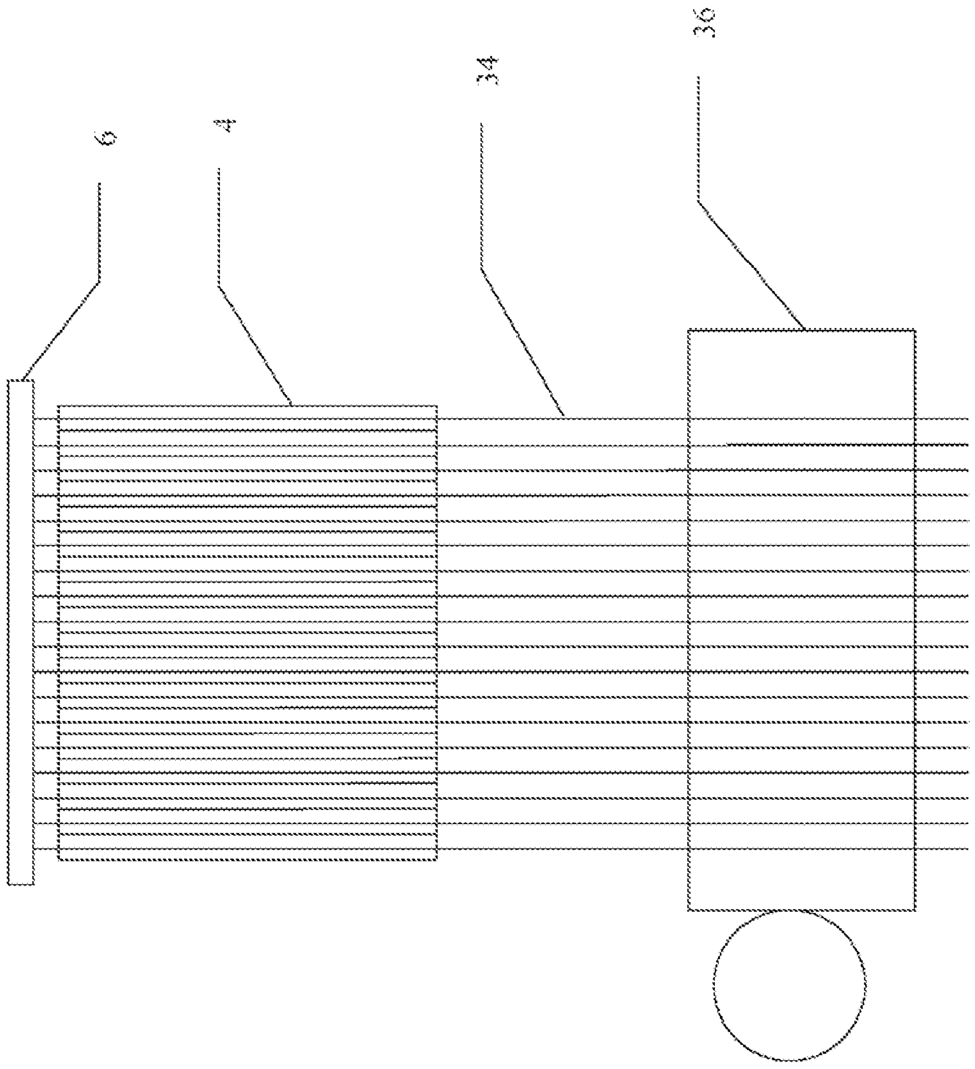
FIG. 8 is a schematic showing the use of a collimator as described herein.

Finally, FIG. 8 shows an example of the collimator 4, with detector 6, as described herein, in use. A patient 36 to be scanned is placed in the path of the collimator 4, and a body part of the patient 36 is scanned by concurrently detecting a plurality of parallel, rectangular slices 34 of the body part, with the geometry of the slices being defined by the arrangement of the collimator and the separation distance of the plates. Preferably, the slices do not substantially overlap each other for the reasons discussed above.

The invention has been described hereinabove using specific examples and embodiments; however, it will be understood by those skilled in the art that various alternatives may be used and equivalents may be substituted for elements and/or steps described herein, without deviating from the scope of the invention. Modifications may be necessary to adapt the invention to a particular situation or to particular needs without departing from the scope of the invention. It is intended that the invention not be limited to the particular implementations and embodiments described herein, but that the claims be given their broadest interpretation to cover all embodiments, literal or equivalent, disclosed or not, covered thereby.

What is claimed is:

1. A collimator for gamma camera imaging, said collimator comprising:

a slot substantially parallel to the axis of rotation of a SPECT scanner;

a plurality of plates, each one of said plates being substantially perpendicular to said slot and also being substantially parallel to a transaxial direction of the SPECT scanner; and a detector associated with said slot and said plurality of plates such that, through any motion of the scanner, said slot, said plates and said detector retain their relative positional relationship.

2. The collimator of claim 1, wherein the slot is defined by a pair of knife edges comprising tungsten.

3. The method of claim 2, wherein the knife edges are coated with one or more of iridium, osmium, rhenium, and depleted uranium.

4. The collimator of claim 2, wherein at least one of said knife edges is single beveled.

5. The collimator of claim 2, wherein at least one of said knife edges is double beveled.

6. The collimator of claim 1, wherein said slot is defined by a pair of parallel rods of substantially circular shape and comprised of tungsten.

7. The collimator of claim 1, wherein said slot is defined by a pair of parallel rods of substantially elliptical shape and comprised of tungsten.

8. The collimator of claim 1, wherein said multiple plates are comprised of lead.

9. The collimator of claim 1, wherein said multiple plates are comprised of a lead alloy including 1% to 5% antimony.

10. The collimator of claim 1, wherein said plates are each substantially pie-wedge shaped.

11. The collimator of claim 1, wherein one or more sheets of thin absorber are positioned between an exit face of said collimator and an input face of said detector, wherein said thin absorber comprises one or more of tin, copper and cadmium.

12. The collimator of claim 11, wherein the total thickness of each one of said plates is between 0.25 mm and 1.5 mm.

13. The collimator of claim 1, wherein said plates are separated by a low density material.

14. The collimator of claim 13 wherein said low density material includes one or more of a polystyrene foam, balsa wood, a carbon aero-gel, and a low density rigid plastic foam.

15. The collimator of claim 1, wherein said plates extend from said slot to a face of said detector.

16. The collimator of claim 1, wherein each one of said plates extends less than the distance from a face of said detector to said slot, but also extends at least ¼ a of said distance, said plates being positioned proximal to said face of said detector.

17. The collimator of claim 1, wherein the distance from the slot to the detector is between 125 mm and 260 mm.

18. The collimator of claim 1, wherein a width of said slot is adjustable from about 1 mm to 12 mm.

19. The collimator of claim 1, wherein said plates are separated from each other by a separation distance, and further wherein said collimator is adapted to modulate its position relative to said detector by an amount substantially equal to one half said separation distance with a frequency of at least twice per acquisition frame time.

20. The collimator of claim 1, wherein said collimator is comprised of exactly one of said slot.

21. The collimator of claim 20, wherein said slot has a width and a length longer than said width, and wherein said plates are distributed in a regular manner across said length of said slot.

22. The collimator of claim 1, wherein said slot has a width and a length longer than said width, and wherein said plates are distributed in a regular manner across said length of said slot.

23. A collimator for a gamma camera imaging, said collimator comprising:

a pair of bars for forming a slot substantially parallel to the axis of rotation of a scanner, wherein a width of said bars is adjustable;

a plurality of plates distributed along said slot, each one of said plates being substantially perpendicular to said slot and also being substantially parallel to a transaxial direction of the scanner, wherein said plates are comprised of a radiation absorbing material;

a low-density material for separating said plates from each other; and a detector associated with said slot and said plurality of plates such that, through any motion of the scanner, said slot, said plates and said detector retain their relative positional relationship.

24. The collimator of claim 23, wherein said plates are separated from each other by a separation distance, and further wherein said collimator is adapted to modulate its position relative to said detector by an amount substantially equal to one half said separation distance with a frequency of at least twice per acquisition frame time.

25. The collimator of claim 23, wherein said collimator is comprised of exactly one of said slot.

26. A method for imaging a body part, said method comprising the steps of:

providing a radiation source;

providing a collimator including a radiation detector, a slot, and a plurality of plates separated from each other and arranged in space with the slot;

providing the focus of the collimator between the body part and the slot; and scanning the body part using the collimator and radiation source, said scanning by concurrently detecting a plurality of parallel, rectangular slices of the body part, the geometry of said slices being defined by said arrangement and said separation, wherein said slices do not substantially overlap each other.

27. The method of claim 26, wherein said plates are separated from each other by a separation distance, said method further comprising the step of modulating a position of the collimator relative to the detector by an amount substantially equal to one half the separation distance with a frequency of at least twice per acquisition frame time.

28. A collimator for gamma camera imaging, said collimator comprising:

exactly one slot substantially parallel to the axis of rotation of a SPECT scanner;

a plurality of plates distributed across said single slot, each one of said plates being perpendicular to said slot and also being parallel to a transaxial direction of the SPECT scanner; and a detector associated with said slot and said plurality of plates such that, through any motion of the scanner, said slot, said plates and said detector retain their relative positional relationship, and wherein said single slot illuminates said detector without using any sweeping action.

29. A collimator for a gamma camera imaging, said collimator comprising:

a slot having a major length substantially parallel to the axis of rotation of a scanner;

a plurality of plates distributed along said major length of said slot, each one of said plates being perpendicular to said slot and also being parallel to a transaxial direction of the scanner, wherein said plates are comprised of a radiation absorbing material; and a detector associated with said slot and said plurality of plates such that, through any motion of the scanner, said slot, said plates and said detector retain their relative positional relationship.

* * * * *